(12) United States Patent  
Kijima

(10) Patent No.: US 11,516,911 B2  
(45) Date of Patent: Nov. 29, 2022

(54) GLASS CIRCUIT BOARD AND STRESS RELIEF LAYER

(71) Applicant: TOPPAN PRINTING CO., LTD., Tokyo (JP)

(72) Inventor: Masahiko Kijima, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/101,677

(22) Filed: Nov. 23, 2020

(65) Prior Publication Data

US 2021/0076491 A1  Mar. 11, 2021

Related U.S. Application Data

(63) Continuation of application No. PCT/JP2019/020434, filed on May 23, 2019.

(30) Foreign Application Priority Data

May 25, 2018  (JP) .............................. JP2018-100723

(51) Int. Cl.
 *H05K 1/03* (2006.01)
 *H05K 1/02* (2006.01)
 *H05K 3/18* (2006.01)

(52) U.S. Cl.
 CPC ......... *H05K 1/0306* (2013.01); *H05K 1/0271* (2013.01); *H05K 3/188* (2013.01);
 (Continued)

(58) Field of Classification Search
 CPC .. H05K 1/03; H05K 1/0271; H05K 2201/017; H05K 2201/095; H05K 2201/068; H01L 23/0217; H01L 23/15
 See application file for complete search history.

(56) References Cited

U.S. PATENT DOCUMENTS 10,672,718 B2  6/2020  Sundaram et al.
2009/0079071 A1 *  3/2009  Webb ................. H01L 23/49833
                                                         257/738

(Continued)

FOREIGN PATENT DOCUMENTS

EP     3 220 417 A1    9/2017
EP     3220417 A1 *  9/2017   ....... H01L 23/49838
(Continued)

OTHER PUBLICATIONS

WO-2017159613-A1 (Translation) (Year: 2021).*
(Continued)

*Primary Examiner* — Timothy J Thompson
*Assistant Examiner* — John B Freal
(74) *Attorney, Agent, or Firm* — Foley & Lardner LLP

(57) ABSTRACT

A glass circuit board includes, on a glass substrate, a stress relief layer, a seed layer, and an electroplated layer including copper plating. The stress relief layer is an insulator formed by dry coating method and applies a compressive residual stress to the glass substrate at room temperature. The stress relief layer thus reduces cracking, fracturing or warpage of the glass substrate caused by thermal expansion and shrinkage of the copper plating due to heating and cooling of the glass circuit board during manufacturing or thermal cycling, ensuring high connection reliability of the glass circuit board.

13 Claims, 7 Drawing Sheets

(52) U.S. Cl.
CPC .................. *H05K 2201/095* (2013.01); *H05K 2203/1194* (2013.01)

(56) References Cited

U.S. PATENT DOCUMENTS

| | | | | |
|---|---|---|---|---|
| 2014/0117508 A1* | 5/2014 | Nishi | ............... | C04B 37/021 257/622 |
| 2016/0111380 A1* | 4/2016 | Sundaram | ......... | H01L 23/49822 438/126 |
| 2017/0250141 A1* | 8/2017 | Imayoshi | .......... | H01L 23/49894 |

FOREIGN PATENT DOCUMENTS

| | | | | | |
|---|---|---|---|---|---|
| JP | 2002359341 | A | * | 12/2002 | ........... H01L 21/486 |
| JP | 2004349603 | A | * | 12/2004 | |
| JP | 2004356160 | A | * | 12/2004 | |
| JP | 3795628 | B2 | * | 7/2006 | |
| JP | 4012375 | B2 | | 11/2007 | |
| JP | 2013-521663 | A | | 6/2013 | |
| JP | 2016-034030 | A | | 3/2016 | |
| WO | WO-2017/159613 | A1 | | 9/2017 | |
| WO | WO-2017159613 | A1 | * | 9/2017 | ....... H01L 29/42384 |

OTHER PUBLICATIONS

JP-2004356160-A (Translated) (Year: 2022).*
JP-2002359341-A (Translated) (Year: 2022).*
JP-2004349603-A (Translated) (Year: 2022).*
Tien CL, Lin TW. Thermal expansion coefficient and thermomechanical properties of SiN(x) thin films prepared by plasma-enhanced chemical vapor deposition. Appl Opt. Oct. 20, 2012;51(30):7229-35. doi: 10.1364/AO.51.007229. PMID: 23089776. (Year: 2022).*
JP-3795628-B2 (Translation) (Year: 2022).*
International Searching Authority, "International Search Report," issued in connection with International Patent Application No. PCT/JP2019/020434, dated Jul. 16, 2019.
International Searching Authority, "Written Opinion," issued in connection with International Patent Application No. PCT/JP2019/020434, dated Jul. 16, 2019.
European Extended Search Report, dated Jul. 5, 2021, issued in corresponding European Patent Application No. 19807206.8 (7 pages).

* cited by examiner

FIG. 1A(a)
FIG. 1A(b)
FIG. 1A(c)
FIG. 1A(d)
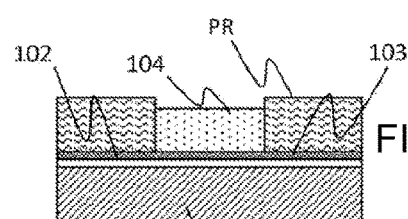
FIG. 1A(e)
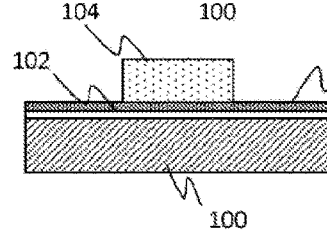
FIG. 1A(f)
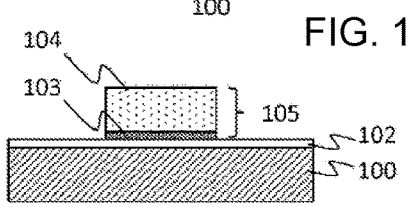
FIG. 1A(g)

FIG. 3(a)
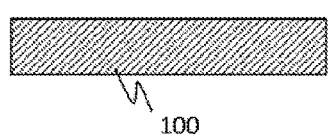
FIG. 3(b)
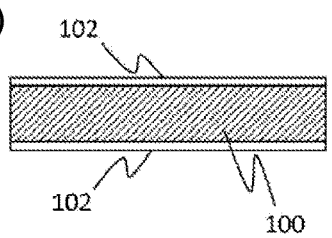
FIG. 3(c)
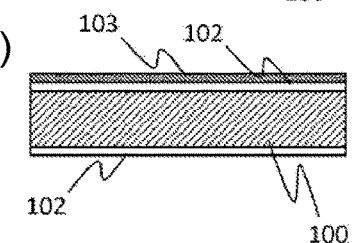
FIG. 3(d)
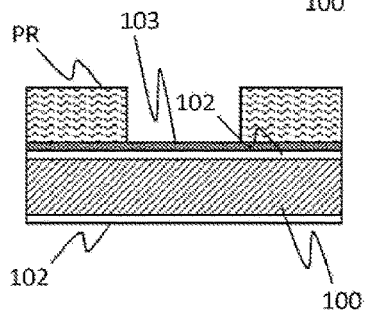
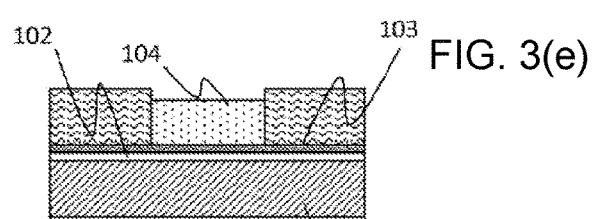
FIG. 3(e)
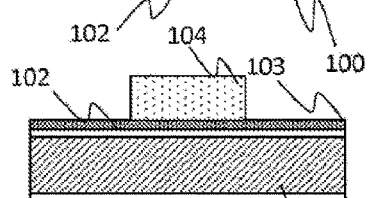
FIG. 3(f)
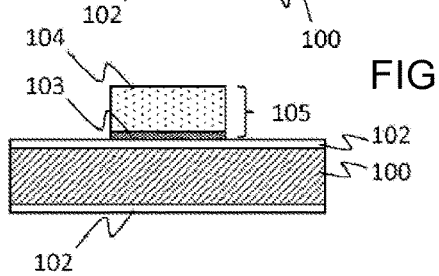
FIG. 3(g)

GLASS CIRCUIT BOARD AND STRESS RELIEF LAYER

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2019/020434, filed on May 23, 2019, which is based upon and claims the benefit of priority to Japanese Patent Application No. 2018-100723, filed on May 25, 2018, the disclosures of which are all incorporated herein by reference in their entireties.

TECHNICAL FIELD

The present invention relates to a glass circuit board and a method of manufacturing the same.

BACKGROUND

The need for higher-density circuit boards that form semiconductor devices is growing as electronic devices increase in functionality and decrease in size. Such circuit boards have substrates typically formed from organic materials such as glass epoxy resin. Recent advances in glass drilling technology have enabled, for example, through holes with a small diameter of 100 μm or less to be formed in glass 300 μm in thickness with pitches of 150 μm or less.

Under such circumstances, electronic circuit boards formed using glass materials have received attention (Patent Literature 1). A circuit board with a glass material as its core (hereinafter referred to as a glass circuit board) has glass with a small coefficient of linear thermal expansion (CTE) of 2 ppm/K to 8 ppm/K, which matches with the thermal expansion of silicon chips, resulting in higher reliability of mounting. Additionally, a high degree of flatness allows high-precision mounting.

Furthermore, the high degree of flatness of glass allows an electronic circuit board to have a finer wiring pattern and higher transmission speeds. In addition, research has been conducted to apply features of glass, i.e., transparency, chemical stability, high elasticity, and inexpensiveness, to electronic circuit boards, and there are expectations for commercialization of interposers for semiconductor devices, circuit boards for imaging devices, and LC duplexers (diplexers) for communication devices.

CITATION LIST

Patent Literature

PTL 1: JP 4012375 B

SUMMARY OF THE INVENTION

Technical Problem

In a glass circuit board, however, the difference in thermal expansion between the glass substrate and the metal wiring layer causes thermal stress to concentrate on the metal layer edges or the glass edges and in particular, around the through holes (through-holes). The stress concentration increases the likelihood of cracking and fracturing in the glass substrate or warpage of the glass substrate, resulting in the problem of a reduction in the wiring connection reliability.

The present invention has been made to improve or even solve the problem described above. An object of the invention is to provide a glass circuit board having high electrical reliability with reduced glass substrate cracking, fracturing or warpage, and a method of manufacturing the glass circuit board.

Solution to Problem

To solve the above problem, a glass circuit board according to the present invention is a glass circuit board including a glass substrate and a conductor circuit layer, characterized by a stress relief layer being provided between the glass substrate and the conductor circuit layer. The stress relief layer is a dielectric film which is an inorganic substance, which is in contact with the glass substrate and applies a compressive residual stress to the glass substrate at room temperature.

A glass circuit board manufacturing method according to the present invention is characterized by: forming a stress relief layer on at least one surface of a glass substrate by dry coating method, the stress relief layer applies a compressive residual stress to the glass substrate at room temperature; and forming a conductor circuit layer by stacking, on the stress relief layer, a seed layer followed by an electroplated layer including copper plating, stacked in this order.

Advantageous Effects of the Invention

The present invention provides a glass circuit board that includes a glass substrate, having high electrical reliability with reduced glass substrate cracking, fracturing or warpage, and a method of manufacturing the glass circuit board, thus enabling an electronic device and an electronic circuit to have higher functionality, smaller size, and higher reliability.

BRIEF DESCRIPTION OF THE DRAWINGS

FIGS. 1A(a), 1A(b), 1A(c), 1A(d), 1A(e), 1A(f), and 1A(g) are a set of schematic cross-sectional views illustrating an example of a method of producing a glass circuit board according to a first embodiment.

FIGS. 3(a), 3(b), 3(c), 3(d), 3(e), 3(f), and 3(g) are a set of schematic cross-sectional views illustrating an example of a method of producing a glass circuit board according to a second embodiment.

DETAILED DESCRIPTION

Figure 1B:
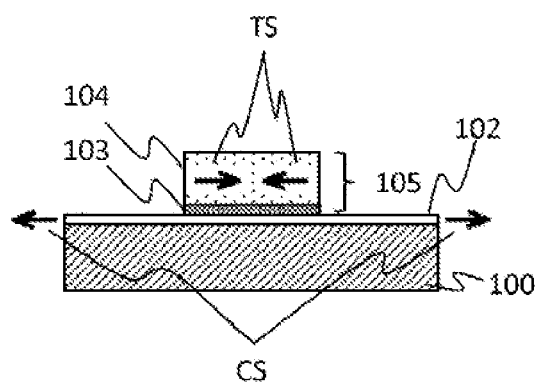
FIG. 1B is a schematic cross-sectional view illustrating residual stress caused in the glass circuit board.

Embodiments of the present invention of will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention.

As used herein, "above" refers to a direction receding from the glass substrate, whereas "below" refers to a direction approaching the glass substrate. In addition, "stress relief layer" refers to a layer having compressive stress at least at room temperature, and in particular, preferably a layer with compressive stress also lasting for a period of time during which the layer at room temperature undergoes a heating process and then returns to room temperature.

First Embodiment

A glass circuit board according to a first embodiment will now be described in detail with reference to FIGS. 1A(a), 1A(b), 1A(c), 1A(d), 1A(e), 1A(f), and 1A(g) and 1B.

FIGS. 1A(a), 1A(b), 1A(c), 1A(d), 1A(e), 1A(f), and 1A(g) are a set of schematic cross-sectional views illustrating a process of forming the glass circuit board according to the first embodiment with a stress relief layer formed immediately on a glass substrate and between the glass substrate and a conductor circuit layer.

As illustrated in FIG. 1A(a), a glass substrate 100 is prepared. The glass substrate 100 is a transparent glass material that has light transparency. The glass may have any components or any mixing ratio of the contained components, and may also be produced by any method. Examples of the glass include alkali-free glass, alkali glass, borosilicate glass, quartz glass, sapphire glass, and photosensitive glass, and any silicate-based glass material may be used. Other glass materials may also be used. However, alkali-free glass is desirable for use in a semiconductor according to the present embodiment. The glass substrate 100 may preferably have a thickness of 1 mm or less. For ease of forming through-holes in the glass and handling during manufacturing, the thickness may be more preferably 0.1 mm or more and 0.8 mm or less.

The glass substrate 100 may be produced through a float process, a down-draw process, a fusion process, an up-draw process, a roll-out process, or other process. and a glass material produced through any process may be used. The glass desirably has a linear expansion coefficient of −1 ppm/K or more and 15.0 ppm/K or less. For glass having a linear expansion coefficient of less than −1 ppm/K, glass material selection is difficult, and the glass is impossible to inexpensively prepare. In contrast, for glass having a linear expansion coefficient of more than 15.0 ppm/K, a silicon chip mounted on the glass circuit board will have lower silicon chip connection reliability. More preferably, the glass may have a linear expansion coefficient of 0.5 ppm/K or more and 8.0 ppm/K or less, and even more preferably, 1.0 ppm/K or more and 4.0 ppm/K or less.

As illustrated in FIG. 1A(b), a stress relief layer 102 is formed on one surface of the glass substrate 100. The stress relief layer 102 applies a compressive residual stress to the glass substrate 100 at room temperature and serves as a layer that moderates differences in expansion and shrinkage between an electroplated layer 104 and the glass substrate 100 caused by heating and cooling in a wiring formation step later. Room temperature is approximately 25° C.

The stress relief layer 102 may be provided immediately on the glass substrate 100 by dry coating method, such as a vacuum evaporation process, a sputtering process, an ion plating process, a molecular beam epitaxy (MBE) process, a laser ablation process, or a chemical vapor deposition (CVD) process, and selected from, for example, alumina, silica, silicon nitride, silicon oxynitride, and tantalum oxide.

In the present embodiment, a silicon nitride layer is formed by CVD as the stress relief layer 102 in view of the ability to control stress by changing the ratio of introduced gases during coating. The silicon nitride layer may desirably have a thickness of 50 nm or more and 1 μm or less. A silicon nitride layer with a thickness of less than 50 nm is insufficient for a stress relief layer. A silicon nitride layer with a thickness of more than 1 μm lacks ease of formation. More preferably, the silicon nitride layer may have a thickness of 100 nm or more and 500 nm or less. Further, since the silicon nitride layer in the present embodiment applies a compressive residual stress to the glass substrate 100 at room temperature, it is desirable that a linear expansion coefficient of the silicon nitride layer is smaller than that of the glass between coating temperature and room temperature. For example, for a substrate that is alkali-free glass, the silicon nitride layer to be used desirably has a linear expansion coefficient of less than 3.8 ppm/K.

Figure 2:
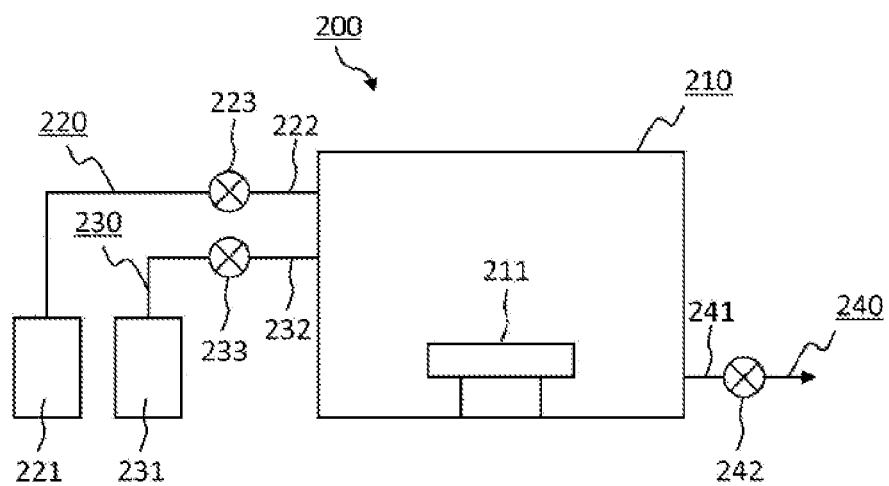
FIG. 2 is a schematic diagram illustrating an apparatus for manufacturing the glass circuit board.

FIG. 2 is a schematic diagram illustrating a manufacturing apparatus 200 for a glass circuit board 10. The manufacturing apparatus 200 includes a chamber 210, gas feeders 220, 230, and a gas exhaust 240. The chamber 210 includes an internal stage 211 on which a substrate is placed. The gas feeder 220 includes a gas cylinder 221, a gas feed pipe 222 connecting the gas cylinder 221 and the chamber 210, and a valve 223 mounted in the middle of the gas feed pipe 222. The gas feeder 230 includes a gas cylinder 231, a gas feed pipe 232 connecting the gas cylinder 231 and the chamber 210, a valve 233 mounted in the middle of the gas feed pipe 232. The gas exhaust 240 includes a valve 242 mounted in the middle of a gas exhaust pipe 241 connected to an exhaust pump. In the present embodiment, the manufacturing apparatus 200 is used to form the above-described silicon nitride layer by CVD. The gas needed for the process is fed as appropriate from the gas cylinders 221, 231. The pressure during coating can be adjusted with the gas feeder valves 223, 233 or the gas exhaust valve 242 to control the membrane stress.

Then, as illustrated in FIG. 1A(c), a seed layer 103 is formed on the surface of the stress relief layer 102. The seed layer 103 functions as a power supply layer for electroplating in wiring formation by a semi-additive process. The seed layer 103 provided on the stress relief layer 102 may be formed by, for example, sputtering or CVD from one or a combination of two or more of, for example, Cu, Ni, Al, Ti, Cr, Mo, W, Ta, Au, Ir, Ru, Pd, Pt, AlSi, AlSiCu, AlCu, NiFe, ITO, IZO, AZO, ZnO, PZT, TiN, $Cu_3N_4$, and a Cu alloy. The seed layer may also be formed by electroless plating.

In the present embodiment, a titanium layer having good adhesion to the stress relief layer 102 and then a copper layer are sequentially formed by sputtering, in terms of electrical characteristics, ease of manufacturing, and cost. The titanium and copper layers for circuit formation on the glass substrate desirably have a total coating thickness of 1 μm or less because of the advantage in forming a fine wiring pattern by a semi-additive process. When the coating thickness is greater than 1 μm, it would be difficult to form a fine wiring pattern with pitches of 30 μm or less.

Then as illustrated in FIG. 1A(d), a photoresist pattern PR is formed. More specifically, a method of forming the photoresist pattern will now be described. First, a photoresist layer is formed on the entire surface of the seed layer 103. The formed photoresist may be a negative dry film resist, a negative liquid resist, or a positive liquid resist. A negative photoresist is desirable because of the low cost and ease of forming a photoresist layer.

For a negative dry film resist, the method of forming the photoresist layer may be, for example, roll lamination or vacuum lamination. For a liquid negative or positive photoresist, the forming method may be selected from slit coating, curtain coating, die coating, spray coating, electrostatic coating, inkjet coating, gravure coating, screen printing, gravure offset printing, spin coating, and doctor coating. Any of the resist layer forming methods may be used.

Then, a desired circuit pattern is formed in the photoresist layer using known photolithography. The resist pattern is formed by aligning the resist pattern so that areas where an electroplated layer are to be formed later are exposed, and then performing exposure and development. The photoresist layer desirably has a thickness of 5 μm or more and 25 μm or less although the thickness depends on the electroplating thickness in the subsequent step. For a resist layer with a thickness of less than 5 μm, the electroplated layer serving as a conductor circuit layer cannot be increased to a thickness of 5 μm or more, and the circuit connection reliability may be lowered. For a resist layer with a thickness of more than 25 μm, it would be difficult to form a fine wiring pattern with pitches of 30 μm or less. Thus, as illustrated in FIG. 1A(d), a glass circuit board is prepared with the photoresist pattern PR formed on it.

Furthermore, as illustrated in FIG. 1A(e), the electroplated layer 104 is formed by electroplating. The electroplating may be electrolytic nickel plating, electrolytic copper plating, electrolytic chromium plating, electrolytic Pd plating, electrolytic gold plating, electrolytic rhodium plating, or electrolytic iridium plating. Electrolytic copper plating is desirable because of ease, low cost, and good electrical conductivity. The electrolytic copper plating desirably has a thickness of 3 μm or more and 30 μm or less. For electrolytic copper plating with a thickness of less than 3 μm, the circuit may be lost due to later etching, and the circuit connection reliability and the electrical conductivity may be lowered further. In contrast, for electrolytic copper plating with a thickness of more than 30 μm, the resist layer also needs to have a thickness of 30 μm or more, increasing the manufacturing costs and furthermore reducing the resist resolution, and thus it would be difficult to form a fine wiring pattern with pitches of 30 μm or less. More preferably, the electrolytic copper plating may have a thickness of 5 μm or more and 25 μm or less.

Then, as illustrated in FIG. 1A(f), photoresist no longer needed after wiring formation by electroplating is removed to expose the seed layer 103. The photoresist may be removed by any method. For example, an alkaline solution may be used to achieve stripping and removal.

Then, as illustrated in FIG. 1A(g), the exposed portion of the seed layer 103 surrounding the electroplated layer 104 is removed and the circuit is electrically isolated to form a conductor circuit layer 105. The conductor circuit layer 105 includes the seed layer 103 and the electroplated layer 104. The seed layer 103 may be removed by any method, and chemical etching may be used to sequentially remove the copper layer and the titanium layer. The etchant is selected as appropriate in accordance with the type of metal to be removed, and not limited to a particular type. Through the above process, a glass circuit board is prepared with the stress relief layer 102 formed immediately on the glass substrate 100 and between the glass substrate 100 and the conductor circuit layer 105.

<Advantageous Effects>

The advantageous effects of the structure of the above-described glass circuit board and the method of manufacturing the glass circuit board will now be described with reference to FIGS. 1A and 1B.

As illustrated in FIG. 1A(b) in the present embodiment, the stress relief layer 102 is formed immediately on the glass substrate 100 by dry coating method. The formation in this manner enables wiring to be formed with the flatness of the glass maintained compared with a stress relief layer such as of resin. For a stress relief layer such as of resin, thermal contraction might cause surface irregularities, compromising the flatness, which is a characteristic of glass.

In addition, as illustrated in FIG. 1A(g), the stress relief layer 102 provided immediately on the glass substrate 100 is capable of applying a compressive residual stress to the glass substrate 100 at room temperature and thus absorbing the stress between the glass substrate 100 and the copper plating of the conductor circuit layer 105 typically having tensile stress at room temperature.

More specifically, with reference to FIG. 1B, the copper layer accounts for a higher proportion of the conductor circuit layer 105, and thus the stress in the conductor circuit layer 105 is governed by the copper layer. When the copper layer at room temperature undergoes a heating process and then returns to room temperature, the copper layer shrinks and generates tensile stress on the substantially unvarying glass substrate 100. Thus, as indicated by arrows in FIG. 1B, tensile stress TS remains also in the conductor circuit layer 105 governed by the copper layer. In contrast, when the silicon nitride layer forming the stress relief layer 102 at room temperature undergoes a heating process and then returns to room temperature, the silicon nitride layer expands. Thus, as indicated by arrows in FIG. 1B, compressive stress CS remains on the substantially unvarying glass substrate 100. Accordingly, stacking the stress relief layer 102 and the conductor circuit layer 105 allows the compressive stress CS in the silicon nitride layer to cancel the tensile stress TS in the conductor circuit layer 105, preventing the tensile stress from reaching the glass substrate 100. More specifically, the stress relief layer 102 can lower the likelihood of cracking and fracturing in the glass substrate 100 that are caused by stress changes in the copper plating of the conductor circuit layer 105 due to heating and cooling of the glass circuit board during manufacturing or thermal cycling.

Furthermore, since the stress relief layer 102 is an insulator, even if the stress relief layer 102 remains on the entire surface of the glass substrate 100, the influence on electrical characteristics is small. In addition, because no patterning step is required, the process can be simplified.

In particular, a silicon nitride coating stress relief layer 102 formed by CVD allows stress at room temperature to be changed by simply varying the pressure during coating, thus easily applying a compressive residual stress on the glass substrate 100.

Second Embodiment

A glass circuit board according to a second embodiment will now be described with reference to FIGS. 3(a), 3(b), 3(c), 3(d), 3(e), 3(f), and 3(g).

FIGS. 3(a), 3(b), 3(c), 3(d), 3(e), 3(f), and 3(g) area set of schematic cross-sectional enlarged views of a part of the glass circuit board according to the second embodiment with a stress relief layer formed immediately on a glass substrate and between the glass substrate and a conductor circuit layer.

FIG. 3(a) shows a glass substrate 100 formed with the same material and dimensions as those of the above-described glass substrate 100. Then, as illustrated in FIG. 3(b), stress relief layers 102 are formed on both surfaces of the glass substrate 100. The stress relief layers 102 are formed with the same process, material, and dimensions as described above.

Then, as illustrated in FIG. 3(c), a seed layer 103 is formed only on the surface of the stress relief layer on one surface of the glass substrate 100. The seed layer 103 is formed with the same process, material, and dimensions as described above. Then, as illustrated in FIG. 3(d), a photoresist pattern PR is formed on the seed layer 103. The photoresist pattern PR is formed with the same process, material, and dimensions as described above.

Then, as illustrated in FIG. 3(e), an electroplated layer 104 is formed by electroplating. The electroplated layer 104 is formed with the same process, material, and dimensions as described above. Then, as illustrated in FIG. 3(f), photoresist no longer needed after wiring formation by electroplating is removed. The photoresist may be removed through a removal/stripping process using a known alkaline solution.

Then, as illustrated in FIG. 3(g), the exposed portion of the seed layer 103 surrounding the electroplated layer 104 is removed. The seed layer 103 may be removed using a known chemical etchant. Through the above process, a glass circuit board is prepared with the stress relief layers 102 stacked immediately on both the surfaces of the glass substrate 100, and with a stress relief layer 102 formed between one surface of the glass substrate 100 and the conductor circuit layer 105.

<Advantageous Effects>

The advantageous effects of the structure of the above-described glass circuit board and the method of manufacturing the glass circuit board will now be described with reference to FIGS. 3(a), 3(b), 3(c), 3(d), 3(e), 3(f), and 3(g). The same advantageous effects as those in the first embodiment have been described above, and thus only different effects will now be described.

As illustrated in FIG. 3(b) in the present embodiment, the stress relief layers 102 are provided on both surfaces of the glass substrate 100. The stress relief layers 102 apply equal compressive residual stress to both the surfaces of the glass substrate to reduce warpage of the glass substrate, enabling the subsequent steps to be performed with high accuracy.

Third Embodiment

A glass circuit board according to a third embodiment will now be described with reference to FIGS. 4(a), 4(b), 4(c), 4(d), 4(e), 4(f), 4(g), and 4(h) to 5.

FIGS. 4(a), 4(b), 4(c), 4(d), 4(e), 4(f), 4(g), and 4(h) are a set of schematic cross-sectional enlarged views of a part of the glass circuit board according to the third embodiment with stress relief layers formed immediately on a glass substrate and between the glass substrate and conductor circuit layers. FIG. 5 illustrates an application example of the glass circuit board in the present embodiment.

Figure 4A:
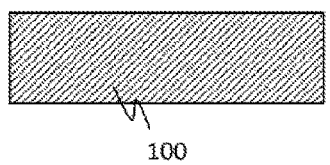
FIGS. 4(a), 4(b), 4(c), 4(d), 4(e), 4(f), 4(g), and 4(h) are a set of schematic cross-sectional views illustrating an example of a method of producing a glass circuit board according to a third embodiment.
Figure 5:
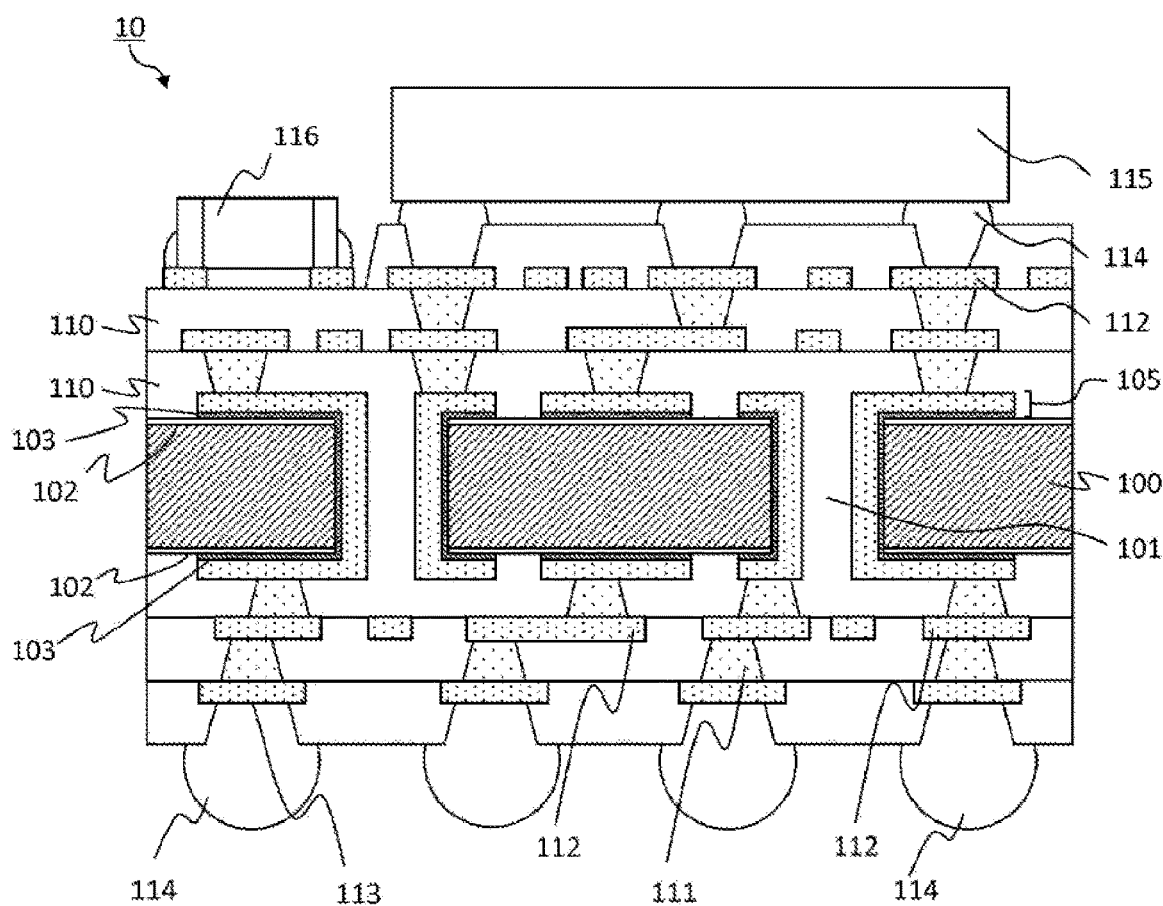
FIG. 5 is a schematic cross-sectional view illustrating an application example of the glass circuit board according to the present invention.

FIG. 4(a) shows a glass substrate 100 formed with the same material and dimensions as those of the above-described glass substrate 100.

Figure 4B:
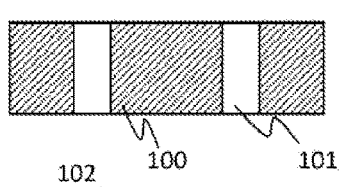

Then, as illustrated in FIG. 4(b), through-holes 101 are formed in the glass substrate 100. Each through-hole 101 may have any cross section and diameter. For example, the through-hole may have a shape with the center diameter being smaller than the top diameter and the bottom diameter, or may have a shape with the bottom diameter being smaller than the top diameter. Alternatively, the through-hole may have a shape with the center diameter being larger than the top diameter and the bottom diameter.

The through-holes may be formed by laser processing or electric discharge machining. For a photosensitive resist material, sandblasting, dry etching, or chemical etching with hydrofluoric acid may be used. Additionally, photosensitive glass may be used to prepare a glass core. Preferably, laser processing or electric discharge machining is desirable because of ease and high throughput. The laser usable for the laser processing may be selected from $CO_2$ lasers, UV lasers, picosecond lasers, femtosecond lasers, and other lasers.

Figure 4C:
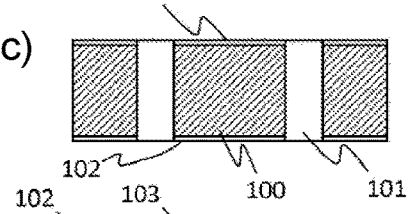

Then, as illustrated in FIG. 4(c), stress relief layers 102 are formed on the surfaces of the glass substrate 100 in which the through-holes 101 are formed. The stress relief layers 102 are formed with the same process, material, and dimensions as described above. Although not shown, the stress relief layers 102 may also be formed inside the through-holes 101.

Figure 4D:
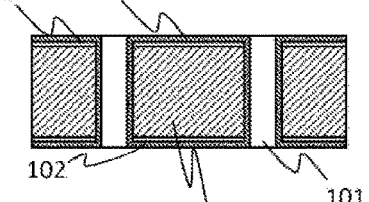

Then, as illustrated in FIG. 4(d), a titanium layer and a copper layer are formed as a part of a seed layer on the surfaces of the stress relief layers 102.

After the titanium layer and the copper layer are formed on the surfaces of the stress relief layers 102, an electroless plating layer is formed as a seed layer 103. With only the titanium layer and the copper layer, a metal coating cannot be formed in all the through-holes 101, reducing connection reliability of the through-holes 101. In the present embodiment, the electroless plating layer can reinforce the metal layer inside the through-holes 101 to improve connection reliability of the through-holes 101.

Although the electroless plating layer may be electroless copper plating or electroless nickel plating, electroless nickel plating is performed because of its good adhesion to glass, a titanium layer, or a copper layer. With a thick nickel plating layer, the formation of a fine wiring pattern would be difficult, and an increase in membrane stress would reduce the adhesion. Thus, the electroless nickel plating desirably has a thickness of 1 µm or less. More preferably, the electroless nickel plating may have a thickness of 0.5 µm or less, and still more preferably 0.3 µm or less. The electroless nickel plating film may include phosphorus that is a co-deposit derived from a reducing agent, and sulfur, lead, and bismuth contained in an electroless nickel plating solution.

Figure 4E:
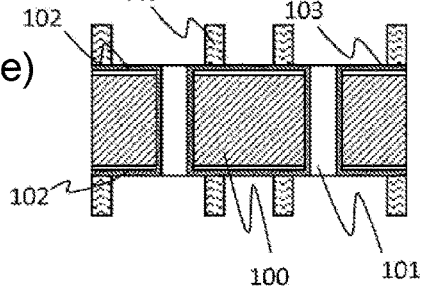
Figure 4F:
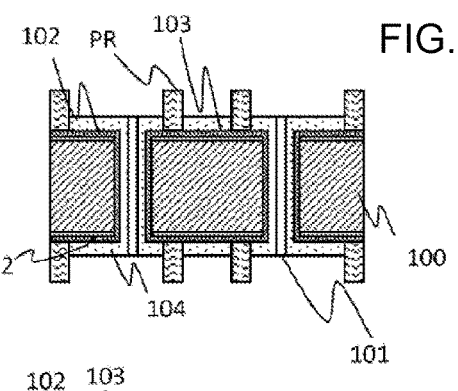

Then, as illustrated in FIG. 4(e), a photoresist pattern PR is formed. The photoresist pattern PR is formed with the same process, material, and dimensions as described above. Then, as illustrated in FIG. 4(f), an electroplated layer 104 is formed by electroplating. The electroplated layer 104 is formed with the same process, material, and dimensions as described above.

Figure 4G:
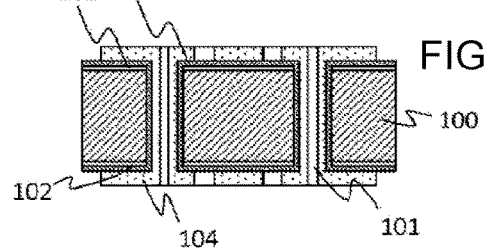
Figure 4H:
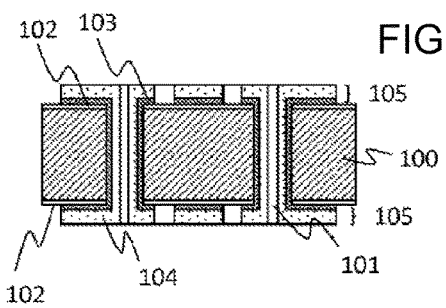

Then, as illustrated in FIG. 4(g), photoresist no longer needed after wiring formation by electroplating is removed. The photoresist may be removed through a removal/stripping process using a known alkaline solution. Then, as illustrated in FIG. 4(h), the exposed portion of the seed layer 103 surrounding the electroplated layer 104 is removed. The seed layer 103 may be removed using a known chemical etchant. Through the above process, a glass circuit board is prepared with the stress relief layers 102 formed immediately on both the surfaces of the glass substrate 100 in which the through-holes 101 are formed, and between the glass substrate 100 and the conductor circuit layers 105. The stress relief layers 102 further reduce warpage of the glass substrate 100.

An application example of the glass circuit board according to the present invention and electronic components will now be described with reference to FIG. 5. As illustrated in FIG. 5, multilayer wiring may be formed by repeating the steps of forming a wiring circuit immediately on the glass, followed by an insulating resin layer 110, via holes 111, and a stacked conductor circuit layer 112 using a known semi-additive or subtractive process. The steps of forming a conductor circuit layer on the glass substrate, an insulating resin layer on the conductor circuit layer, and via holes in the insulating resin layer may also be repeated any appropriate number of times. Furthermore, solder balls 114 may be formed after the formation of external connection terminals 113, and additionally a semiconductor chip 115 and a chip component 116 may be mounted.

A method of forming the multilayer wiring will now be described. The multilayer wiring may be formed by a known method.

Examples of insulating resins usable as the multilayer-wiring layers include epoxy resin, polyimide, maleimide resin, polyethylene terephthalate, polyphenylene oxide, liquid crystal polymer, and a composite material thereof, or photosensitive polyimide resin, photosensitive polybenzoxazole, and photosensitive acrylic-epoxy resin. The insulating resin layer 110 may be formed by any method. For a sheet resin, vacuum lamination, vacuum pressing, or roll lamination may be used. For a liquid resin, the forming method may be selected from slit coating, curtain coating, die coating, spray coating, electrostatic coating, inkjet coating, gravure coating, screen printing, gravure offset printing, spin coating, and doctor coating.

The insulating resin layer has a thickness of preferably 5 $\mu$m or more and 50 $\mu$m or less. For an insulating resin layer with a thickness of more than 50 $\mu$m, it would be difficult to reduce the diameter of the via holes 111 that can be formed in the insulating resin layer, resulting in a disadvantage in increasing the wiring density. For an insulating resin layer with a thickness of less than 5 $\mu$m, it would be difficult to ensure inter-layer insulation.

For non-photosensitive insulating resin, the via holes 111 may be formed in the multilayer wiring by laser processing. Although the laser may be a $CO_2$ laser, UV laser, picosecond laser, or femtosecond laser, preferably a UV laser or $CO_2$ laser is simpler and more desirable. For photosensitive insulating resin, the via holes 111 may be formed using photolithography. After the formation of the via holes, it is desirable to roughen the resin surfaces by desmearing using a permanganic acid solution as appropriate, and clean the inside of the via holes 111 to improve the adhesion to the stacked conductor circuit layer 112. Alternatively, the resin surfaces and the inside of the via holes may be cleaned by plasma treatment.

The stacked conductor circuit layer 112 may be formed by a known method. More specifically, after the formation of the via holes, the entire surface of the resin is coated with a thin film metal layer as a seed layer having a thickness of approximately 1 $\mu$m. The method of forming the seed layer may be known electroless copper plating or electroless nickel plating. Alternatively, the thin film metal layer may be formed by sputtering. For electroless plating, the seed layer is desirably an electroless copper plating layer. For electroless copper plating, a Pd layer that is a catalyst may be provided in the resin-copper interface.

To form the seed layer by sputtering, one or a combination of two or more of Cu, Ni, Al, Ti, Cr, Mo, W, Ta, Au, Ir, Ru, Pd, Pt, AlSi, AlSiCu, AlCu, NiFe, and a Cu alloy may be used. More preferably, the sputtered layer may be a titanium layer/copper layer because of good adhesion and ease of later removal by etching.

After the formation of the metal layer on the resin, wiring is formed. In a known semi-additive process, resist pattern formation by photolithography, electroplating, resist stripping, and seed layer removal may be performed to form a circuit. In a subtractive process, electroplating on the entire surface of the seed layer, resist pattern formation, etching, and resist stripping may be performed to form a circuit layer. The electroplating is desirably electrolytic copper plating in terms of electrical conductivity and cost.

The insulating resin layer 110 in FIG. 5 may be any outermost layer such as a solder resist. The external connection terminals 113 may also be subjected to surface treatment. The surface treatment improves bonding with the solder balls 114. The surface treatment allows the formation of a plating film of tin or a tin alloy, a plating film of electroless Ni—P/electroless Pd—P/Au, a plating film of electroless Ni—P/Au, or other plating film. Alternatively, pre-soldering treatment, or organic coating treatment such as organic solderability preservative (OSP) may be performed.

The solder balls 114 may be formed by screen printing, a solder ball transfer and mounting method, or electroplating. The solder balls may be composed of one or a combination of two or more of tin, silver, copper, bismuth, lead, zinc, indium, and antimony. The metal materials may have any mixing ratio. The solder may be replaced with pads for wire bonding.

<Advantageous Effects>

The advantageous effects of the structure of the above-described glass circuit board and the method of manufacturing the glass circuit board will now be described with reference to FIG. 5. The same advantageous effects as those in the first and the second embodiments have been described above, and thus only different effects will now be described.

As illustrated in FIG. 5 in the present embodiment, the structure and the method can be applied to a glass circuit board 10 in which the conductor circuit layers 105 and the multilayer wiring are formed on both surfaces of the glass substrate 100.

The glass circuit board 10 manufactured based on the above embodiments will now be compared with a typical glass circuit board.

Comparative Example

Figure 6:
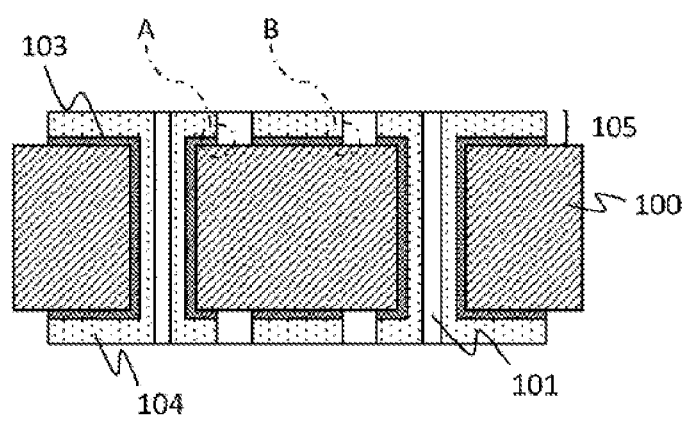
FIG. 6 is a schematic cross-sectional view illustrating an example of a glass circuit board according to a comparative example.

As a comparative example, a glass circuit board illustrated in FIG. 6 was prepared without the stress relief layer 102. The manufacturing method was the same as described in the third embodiment except for the stress relief layer 102 illustrated in FIG. 4(c).

In this comparative example, cracking and fracturing were found in the glass substrate that were caused by thermal expansion and shrinkage of the copper plating in the conductor circuit layer 105 due to heating and cooling of the glass circuit board during manufacturing of the glass circuit board or thermal cycling. In particular, cracking and fracturing were significant at a part indicated by dot-dashed line A in FIG. 6 near a through-hole 101 or an end of the conductor circuit layer 105 indicated by dot-dashed line B. As a result, a short circuit or an open circuit may occur in the glass circuit board, and lower connection reliability. In contrast, in an example with the stress relief layers 102 provided (see FIG. 4(h)), cracking and fracturing were not found in the glass substrate that were caused by thermal expansion and shrinkage of the copper plating in the conductor circuit layer 105 due to heating and cooling of the glass circuit board during manufacturing of the glass circuit board or thermal cycling.

The above embodiments are mere examples, and specific details may be modified as appropriate as a matter of course.

According to the present invention, an insulating stress relief layer formed by dry coating method between a glass substrate and a conductor circuit layer including copper plating is capable of applying a compressive residual stress to the glass substrate at room temperature and thus absorbing the stress between the glass substrate and the copper plating of the conductor circuit layer typically having tensile stress at room temperature. The stress absorption can reduce cracking and fracturing in the glass substrate or warpage of the glass substrate that are caused by thermal expansion and shrinkage of the copper plating in the conductor circuit layer due to heating and cooling of the glass circuit board during manufacturing or thermal cycling, ensuring connection reliability of the electrical circuit and connection reliability of the external connection terminals.

The present invention also enables the glass circuit board to be manufactured with high connection reliability. The glass circuit board according to the present invention is usable in producing a semiconductor package substrate, an interposer, and a substrate for optical elements or manufacturing electronic components.

REFERENCE SIGNS LIST

10 Glass circuit board; 100 Glass substrate; 101 Through-hole (through hole); 102 Stress relief layer; 103 Seed layer; 104 Electroplated layer; 105 Conductor circuit layer; 110 Insulating resin layer (solder resist layer); 111 Via hole; 112 Stacked conductor circuit layer; 113 External connection terminal; 114 Solder ball; 115 Semiconductor chip; 116 Chip component; 200 Manufacturing apparatus; 210 Chamber; 211 Stage; 220 Gas feeder; 221 Gas cylinder; 222 Gas feed pipe; 223 Valve; 230 Gas feeder; 231 Gas cylinder; 232 Gas feed pipe; 233 Valve; 240 Gas exhaust; 241 Gas exhaust pipe; 242 Valve.

What is claimed is:

1. A glass circuit board, comprising:
a glass substrate that includes a plurality of through-holes extending from a first surface of the substrate to a second surface of the substrate, the second surface being opposite to the first surface; a first conductor circuit layer, and
a first stress relief layer between the first surface of the glass substrate and at least a portion of the first conductor circuit layer, wherein the first stress relief layer is a silicon nitride layer having a thickness from 50 nm to 1 µm,
the first stress relief layer is in contact with the first surface of the glass substrate and applies a compressive residual stress to the glass substrate at room temperature, and
the first stress relief layer does not cover an inner surface of any through-hole of said plurality of through-holes.

2. The glass circuit board of claim 1, further comprising a second stress relief layer on the second surface of the glass substrate, the second stress relief layer is a silicon nitride layer having a thickness from 50 nm to 1 µm, wherein the second stress relief layer does not cover an inner surface of any through-hole of said plurality of through-holes.

3. The glass circuit board of claim 1, further comprising a second stress relief layer and a second conductor circuit layer on the second surface of the glass substrate, and
the second stress relief layer between a portion of the second conductor circuit layer and the second surface of the glass substrate, the second stress relief layer is a silicon nitride layer having a thickness from 50 nm to 1 µm, wherein the second stress relief layer does not cover an inner surface of any through-hole of said plurality of through-holes.

4. The glass circuit board of claim 3, wherein the second conductor circuit layer includes a copper plating layer and a seed layer in contact with the second stress relief layer.

5. The glass circuit board of claim 1, wherein the first conductor circuit layer includes a copper plating layer and a seed layer in contact with the first stress relief layer.

6. The glass circuit board of claim 5, wherein the copper plating layer covers inner surfaces of the through-holes.

7. The glass circuit board of claim 5, wherein the copper plating layer has a thickness of 3 µm or more and 30 µm or less.

8. The glass circuit board of claim 5, wherein the copper plating layer has a thickness of 5 µm or more and 25 µm or less.

9. The glass circuit board of claim 5, wherein the seed layer formed by electroless plating.

10. The glass circuit board of claim 1, wherein the first stress relief layer covers all the first surface of the glass substrate other than the through-holes.

11. The glass circuit board of claim 1, wherein the glass substrate is made of an alkali-free glass, the first stress relief layer has a linear expansion coefficient of less than 3.8 ppm/K.

12. The glass circuit board of claim 1, wherein the glass substrate is made of glass having a linear expansion coefficient of 1.0 ppm/K or more and 4.0 ppm/K or less.

13. The glass circuit board of claim 1, wherein the conductor circuit layer comprises an electroplated metal layer covering inner surfaces of the through-holes.

* * * * *